United States Patent [19]

Park

[11] Patent Number: 4,794,431

[45] Date of Patent: Dec. 27, 1988

[54] PACKAGE FOR PHOTOACTIVATED SEMICONDUCTOR DEVICE

[75] Inventor: Khee Park, Los Angeles, Calif.

[73] Assignee: International Rectifier Corporation, Los Angeles, Calif.

[21] Appl. No.: 854,425

[22] Filed: Apr. 21, 1986

[51] Int. Cl.[4] .................... H01L 31/12; H01L 31/16; H01L 29/60

[52] U.S. Cl. ........................ 357/19; 357/30; 357/70; 357/85; 250/551

[58] Field of Search .............. 357/19, 85, 30, 70; 250/551

[56] References Cited

U.S. PATENT DOCUMENTS

| | | | |
|---|---|---|---|
| 3,893,158 | 7/1975 | Lincoln | 357/19 |
| 4,112,308 | 9/1978 | Olschewski et al. | 357/19 |
| 4,114,177 | 9/1978 | King | 357/19 |
| 4,152,044 | 5/1979 | Liu | 357/19 |
| 4,322,628 | 3/1982 | Tanaka | 357/19 |
| 4,535,251 | 8/1985 | Herman et al. | 307/311 |
| 4,596,050 | 6/1986 | Rogers | 250/551 |

FOREIGN PATENT DOCUMENTS

| | | | |
|---|---|---|---|
| 2431375 | 1/1976 | Fed. Rep. of Germany | 357/19 |
| 54-57885 | 5/1979 | Japan | 357/19 |

Primary Examiner—Andrew J. James
Assistant Examiner—Jerome Jackson
Attorney, Agent, or Firm—Ostrolenk, Faber, Gerb & Soffen

[57] ABSTRACT

Included in a package for a photoactivated semiconductor device is a planar lead pattern. The lead pattern may comprise a repeated pattern of a lead frame. A pair of photoactivated semiconductor devices are mounted on respective portions of the lead frame. The semiconductor devices may be rectangular in configuration so as to have four generally-straight edges. A light-emitting device is mounted on a respective portion of the lead pattern. The geometrical interrelationship between the semiconductor devices and the light-emitting device achieves a high degree of optical coupling between the light-emitting device and the semiconductor devices. In particular, the semiconductor devices are positioned such that confronting, respective first edges of these devices are out of parallel with each other. The light-emitting device is then positioned to be orthogonally offset from both of the respective first edges of the semiconductor devices. To further enhance the optical coupling in the package, a transparent material is provided over the semiconductor devices and the light-emitting device. The transparent material is configured with a convex shape above the planar lead pattern. Atop the transparent material is an opaque covering material which forms an interface with the transparent material that is highly reflective to light in the visible and infrared bands.

10 Claims, 3 Drawing Sheets

PACKAGE FOR PHOTOACTIVATED SEMICONDUCTOR DEVICE

BACKGROUND OF THE INVENTION

The present invention relates to a semiconductor package in which a light-emitting device and at least one photoactivated semiconductor device are included and optically coupled to each other. More particularly, the invention relates to a package for a photoactivated semiconductor device that includes a planar lead pattern which may comprise a severed portion of a lead frame, and to a method of manufacturing such package.

The use of a lead frame in the packaging of semiconductor devices is highly desirable. A lead frame comprises a strip of metallic lead material having repeated lead patterns along the length of the frame. Semiconductor devices may be mounted onto appropriate portions of a lead frame, and then encapsulated in a suitable manner. Thereupon, the individual lead pattern associated with a packaged semiconductor device or devices is severed from the remainder of the lead frame.

It would be desirable to provide a package for photoactivated semiconductor devices and an associated light-emitting device that incorporates a planar lead pattern, whereby the lead pattern can comprise a portion of a lead frame. Light emitted from the light-emitting device is transmitted to the photoactivated devices, by either direct or reflected radiation. It is preferable that the photoactivated devices receive light from the light-emitting device which is reflected a minimal number of times. This insures that the light received by the photoactivated devices is minimally attenuated to produce high turn-on sensitivity for the photoactivated device. A typical package for photoactivated semiconductor devices and a light-emitting device is described and claimed in U.S. Pat. No. 4,535,251, of common assignee with the present invention. The present invention seeks to improve over the package of the foregoing patent by providing such features as more sensitive turn-on of photoactivated devices, and greater mass producibility.

SUMMARY OF THE INVENTION

It, accordingly, is an object of the present invention to provide a package for a photoactivated semiconductor device that includes a planar lead frame.

A further object of the invention is to provide a package for a photoactivated semiconductor device in which the optical coupling between a light-emitting device and a photoactivated semiconductor device is maximized.

Another object of the invention is to provide a package for a photoactivated semiconductor device which is simple in construction and easy to manufacture.

A still further object of the invention is to provide a method of manufacturing a package for a photoactivated semiconductor device that is simple to carry out and that can mass produce such packages.

The foregoing objects are realized in a package for a photoactivated semiconductor device described in detail below. The package includes first and second photoactivated semiconductor devices. Each of the devices is generally rectangular in configuration and thus has four generally-straight edges. The package includes a light-emitting device optically coupled to the first and second semiconductor devices. In response to a control signal, the light-emitting device emits light that is received by the photoactivated devices so as to activate these devices. A planar lead pattern is included in the package. The first and second semiconductor devices are mounted on the lead pattern, along with the light-emitting device. The first and second semiconductor devices are positioned with respect to the light-emitting device in a manner that maximizes optical coupling between the light-emitting device and the photoactivated devices. In particular, the semiconductor devices are arranged such that a pair of confronting, first edges are arranged to be out of parallel with one another. The light-emitting device is positioned to be orthogonally offset from each of the first edges of the first and second semiconductor devices.

A transparent covering is provided over the first and second semiconductor devices and the light-emitting device. In accordance with the package described in detail below, the transparent covering extends upwardly from the planar lead pattern in a convex shape. As a result, the upper surface of the transparent covering reflects onto the first and second photoactivated devices a maximum amount of light that is received directly from the light-emitting device. This improves optical coupling between the light-emitting device and the first and second photoactivated semiconductor devices, and, hence, increases the turn-on reliability of the semiconductor devices.

According to a method of manufacturing the package for a photoactivated semiconductor device described thus far, a lead frame is provided in which there exists a repeated lead pattern. The first and second photoactivated semiconductor devices are positioned and mounted on respective portions of the lead pattern. The light-emitting device is also positioned and mounted on a respective, separate portion of the lead pattern. In particular, the positioning of the first and second semiconductor devices with respect to the light-emitting device is done in accordance with the above-described geometry to attain a high optical coupling between the light-emitting device and the first and second semiconductor devices.

In accordance with a further feature of the present manufacturing method, a transparent material is applied to the first and second semiconductor devices and the light-emitting diode. This is accomplished by the process of transfer molding. Thereafter, an opaque material is applied to the transparent material, whereby the interface between the transparent material and the opaque material becomes highly reflective to light. The opaque material is preferably white in color to maximize the reflective properties of the interface just mentioned. The opaque material covering completes the semiconductor device. Thereafter, the lead pattern is severed from the lead frame to provide a separate and completed package for a photoactivated semiconductor device.

BRIEF DESCRIPTION OF THE DRAWINGS

Other objects and features of the invention will become apparent from the following description of the preferred embodiments of the invention considered in conjunction with the accompanying drawings in which.

DESCRIPTION OF THE PREFERRED EMBODIMENTS

Figure 1:
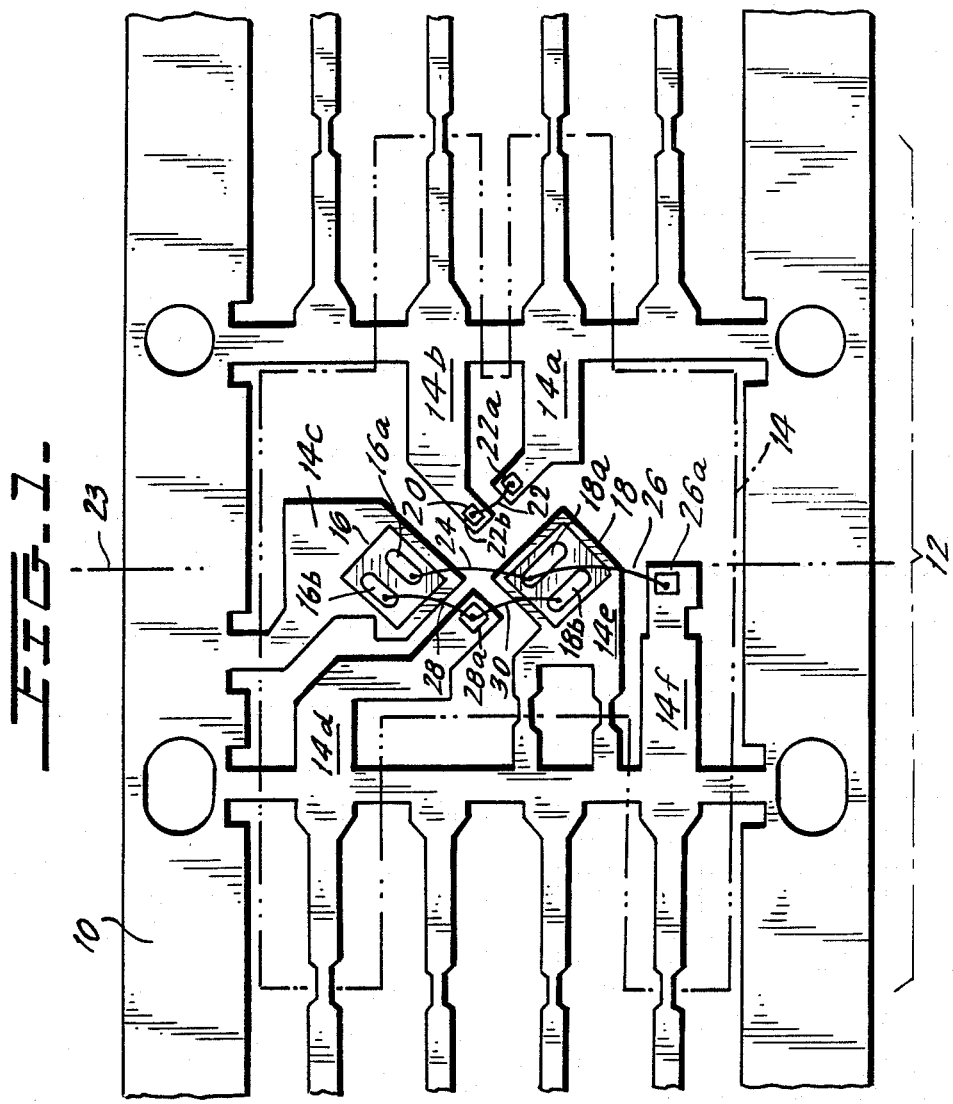
FIG. 1 is a top plan view of a lead frame containing a repeated lead pattern on which a pair of photoactivated semiconductor devices and a light-emitting device are mounted.

FIG. 1 illustrates a metallic lead frame 10 that is planar in configuration. Lead frame 10 extends to the left and right as viewed in FIG. 1, and includes a repeated lead pattern laterally bounded by the ends of bracket 12 (hereinafter "lead frame portion 12"). The lead frame 10 may be formed, by way of example, of a copper alloy such as the alloy sold under the tradename "OLIN 151", which can be plated with gold, silver and/or nickel.

Lead frame portion 12 includes a conductor or lead pattern bounded within a dashed line 14 (hereinafter "lead pattern 14"). The lead pattern 14 is ultimately severed from the lead frame 10, as described below.

Mounted atop the lead pattern 14 are photoactivated semiconductor devices 16 and 18, and a light-emitting device 20. The photoactivated devices may comprise a pair of photoactivated devices known as "ChipSwitches", sold by International Rectifier of El Segundo, Calif. The photoactivated devices are aligned with each other along an axis 23, shown in phantom. The light-emitting device 20 may comprise a light-emitting diode, for example.

The lead pattern 14 includes individual portions 14a, 14b, 14c, 14d, 14e and 14f. These portions 14a–14f become electrically isolated from each other when the lead pattern 14 is severed from the lead frame 10.

Lead portions 14a and 14b are the main leads for the light-emitting device 20. Lead 14a is connected to the device 20 by a wire 22 with ends thermosonically wire bonded to respective bonding pads 22a and 22b. The bonding pad 22a comprises an area on lead 14a, and the bonding pad 22b comprises an area atop the device 20. Lead 14b is electrically connected to the light-emitting device 20 via an epoxy that is made electrically conductive by the addition of silver particles, for example.

The photoactivated semiconductor devices 16 and 18 are provided with main power terminals on the tops of the devices. The first main terminal 16a of the device 16 is electrically shorted to a main terminal 18a of the device 18 via a wire 24 having its ends ultrasonically bonded to main terminals 16a and 18a. In turn, the main terminals 16a and 18a are connected to the lead portion 14f via a further wire bond 26 having one end connected to the main terminal 18a and the other end connected to a bonding pad 26a atop the lead portion 14f.

Similarly, a second main terminal 16b of the device 16 is connected via a wire bond 28 to a bonding pad 28a on the lead portion 14d. The second main terminal 18b of the device 18 is also connected to the bonding pad area 28a by a wire bond 30.

As a result of the foregoing interconnections, the semiconductor devices 16 and 18 are connected parallel with each other and utilize lead portions 14d and 14f as a set of main leads.

The semiconductor devices 16 and 18 are each of generally rectangular configuration, whereby each device has four generally straight edges.

Figure 2:
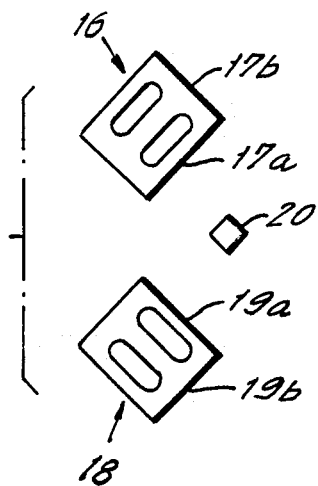
FIG. 2 is a schematic plan view of a geometrical interrelationship between the semiconductor devices and light-emitting device of FIG. 1.

Referring to the schematic plan view of FIG. 2, the device 16 can be seen to have straight edges 17a and 17b, for example, while device 18 can be seen to have straight edges 19a and 19b. In accordance with an aspect of the invention, the straight sides 17a and 19a of the devices 16 and 18, respectively, are both oriented orthogonally from the light-emitting device. As a result of this arrangement, the optical coupling between the light-emitting device 20 and both of the photoactivated devices 16 and 18 is considerably increased.

Figure 3:
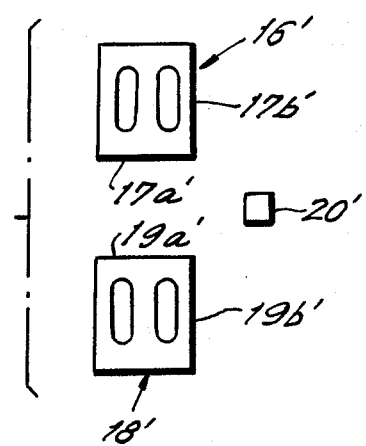
FIG. 3 is a schematic plan view of a prior art geometrical interrelationship between a pair of photoactivated semiconductor devices and a light-emitting device.

By way of contrast, a prior art arrangement of a light-emitting device and a pair of photoactivated semiconductor devices is illustrated in FIG. 3. In this prior art configuration, neither edge 17a' nor 17b' is oriented orthogonally to the light emitting device 20'. The same is true for device sides 19a' and 19b'. While a moderate degree of optical coupling is achieved in the prior art arrangement of FIG. 3, the inventive arrangement of FIG. 2 achieves a significantly greater degree of optical coupling and results in higher turn on sensitivity for the photoactivated devices 16 and 18.

Figure 4:
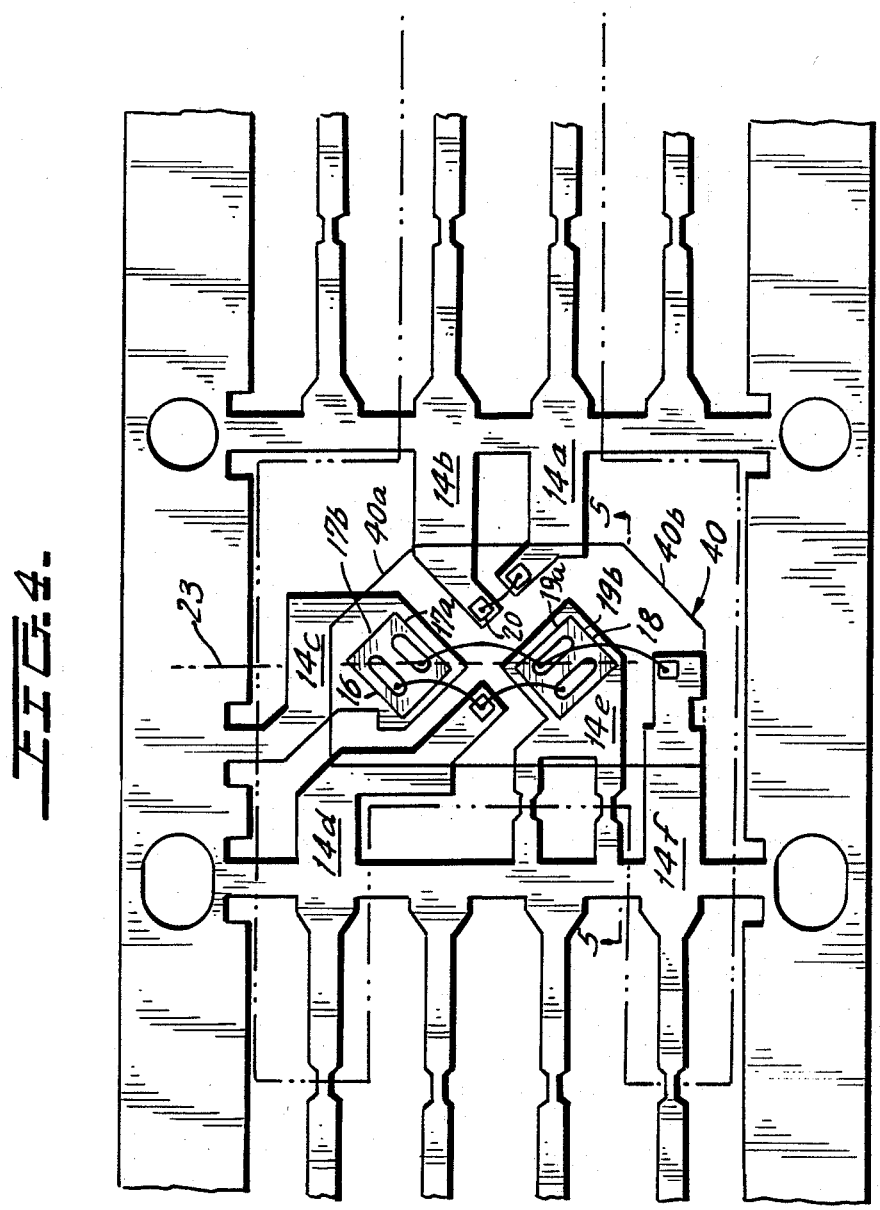
FIG. 4 is a view of the lead frame and device structure of FIG. 1 after a transparent material has been applied to the semiconductor devices and light-emtting device.

To further ensure a high degree of optical coupling between the light emitting device 20 and the semiconductor devices 16 and 18, a transparent material 40 is then applied to these devices, as illustrated in FIG. 4. The transparent material 40 has a convex curvature or plane surface extending upwardly from the lead pattern 14.

Figure 5:
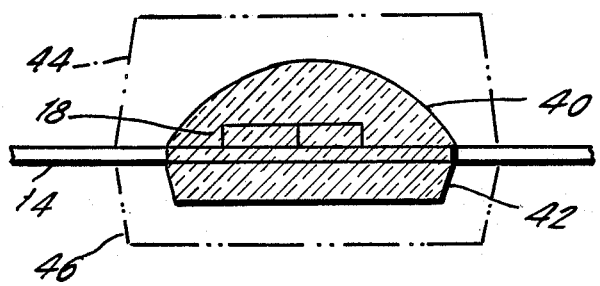
FIG. 5 is a cross-sectional view taken at lines 5—5 of FIG. 4.

A preferred configuration of the transparent material 40 is best depicted in the cross-sectional view of FIG. 5. A layer of transparent material 42 beneath the lead frame 14 is preferably included. The inclusion of the transparent material 42 helps assure that a good optical path exists between the light-emitting device 20 and the semiconductor devices 16 and 18. The transparent material 40 and transparent material 42 adjoin each other, as illustrated in FIG. 4, in the space between the lead portion 14b and 14c, for example.

To enhance the optical coupling between the light emitting device 20 and the semiconductor devices 16 and 18, the lateral periphery of the transparent material 40 preferably includes offset edges 40a and 40b, as illustrated in FIG. 4. Edge 40a is parallel to edge 17b of device 16, which is located at one end of axis 23 which passes through the devices 16 and 18. Similarly, the edge 40b of transparent material 40 is parallel to edge 19b of the device 18. The edge 19b is located at the other end of axis 23.

Transparent material 40 and 42 is preferably applied to the lead frame 10 by the process of transfer molding. In this process, a pair of opposing dies (not shown), one above the lead frame 10 and one below the lead frame, are configured in the outline of the final shape of transparent material 40 and 42. Transparent molding material is then injected into the void formed between the opposing dies. When transfer molding is used to form the transparent material 40 and 42, a suitable molding compound comprises an epoxy such as that sold under the tradename of "NITTO NT8500P". Other suitable transparent molding compounds will be apparent to those skilled in the art.

The convex configuration of the transparent material 40 (FIG. 5) ensures that the upper surface of the material 40 reflects onto the photoactivated devices 16 and 18 a maximum amount of light that is received directly from the light-emitting device 20. This may be contrasted with prior art configurations in which transparent material placed atop the photoactivated semiconductor devices in a light-emitting device exhibits a concave configuration. Due to such concave configuration, light from the light-emitting device is often reflected many times off the surface of the transparent material before reaching the photoactivated device.

In accordance with a further aspect of the invention, an opaque material 44, depicted in phantom in FIG. 5, is placed atop the transparent material 40 and lead pattern 14. Similarly, an opaque material 46 is provided to cover lower transparent material 42 and the lead pattern 14. The opaque material 44 and 46 is preferably white in color to provide a high degree of reflection at the interface between the transparent material 40, 42 and the opaque material 44, 46. This achieves a high degree of optical coupling between the light emitting device and the semiconductor devices 16 and 18. Additionally, the provision of the opaque material 44 and 46 completes the packaging of the devices 16, 18 and 20.

The opaque material 44 and 46 is preferably provided through the process of transfer molding in the same manner described above for providing the transparent material 40 and 42.

The foregoing describes a package for a photoactivated semiconductor device incorporating a planar lead frame. A high degree of optical coupling is achieved between a light-emitting device and a photoactivated semiconductor device within the package. The package is simple in construction and easy to manufacture. A simple method suitable for mass-production is described for manufacturing the package.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. A package for photoactivated semiconductor devices, said package comprising:
   first and second photoactivated semiconductor devices, each of said devices being rectangular in configuration so as to each have four generally-straight side edges;
   a light emitting device optically coupled to said first and second semiconductor devices for activating said first and second devices in response to a control signal applied to said light emitting device;
   a planar lead pattern on which said pair of semiconductor devices and said light emitting devices are mounted;
   said first and second semiconductor devices being positioned with respect to each other such that a respective first side edge of each device confronts the other first side edge in a non-parallel manner; and
   said light emitting device being positioned with respect to said first and second semiconductor devices such that the light emitting device is orthogonally offset from both of said respective first edges of said semiconductor devices, whereby the optical coupling between said light emitting device and said first and second semiconductor devices is improved.

2. The package of claim 1, wherein said respective first edges are positioned orthogonally to each other.

3. The package of claim 1, wherein said light emitting device comprises a light emitting diode.

4. The package of claim 1, further comprising:
   a transparent material covering said first and second semiconductor devices and said light emitting device and optically coupling together these devices;
   said transparent material extending above said planar lead pattern in a convex shape, whereby the upper surface of said transparent material reflects a large amount of previously unreflected light onto said first and second semiconductor devices which originates from said light emitting device.

5. The package of claim 4, wherein said transparent material covering said first and second semiconductor devices and said light emitting device is configured in a partially cylindrical shape above said lead pattern.

6. The package of claim 4, wherein said transparent covering comprises a clear epoxy.

7. The package of claim 4, furhter comprising an opaque material covering said transparent material and forming an optically reflective interface between said opaque material and said transparent material.

8. The package of claim 7, wherein said opaque material is white in color.

9. The package of claim 1, wherein said first and second photoactivated semiconductor devices comprise field effect semiconductor devices.

10. The package of claim 4, wherein:
    an axis passes through said first and second semiconductor devices;
    said first semiconductor device has a second edge adjacent to its first edge and situated at an axial end of the arrangement of said first and second semiconductor devices;
    said second semiconductor device has a second edge adjacent to its first edge and situated at the other axial end of the arrangement of said first and second semiconductor devices; and
    said transparent material has a first laterally facing straight edge parallel to said second edge of said first semiconductor device, and a further laterally facing straight edge parallel to said second edge of said second semiconductor device.

* * * * *